(12) United States Patent
Lindert et al.

(10) Patent No.: US 7,981,756 B2
(45) Date of Patent: Jul. 19, 2011

(54) COMMON PLATE CAPACITOR ARRAY CONNECTIONS, AND PROCESSES OF MAKING SAME

(75) Inventors: Nick Lindert, Beaverton, OR (US); Brian Doyle, Portland, OR (US); Dinesh Somasekhar, Portland, OR (US); Christopher J. Jezewski, Hillsboro, OR (US); Swaminathan Sivakumar, Beaverton, OR (US); Kevin Zhang, Portland, OR (US); Stephen Wu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 12/317,656

(22) Filed: Dec. 22, 2008

(65) Prior Publication Data
US 2010/0155887 A1    Jun. 24, 2010

(51) Int. Cl.
*H01L 21/20* (2006.01)

(52) U.S. Cl. . 438/381; 438/386; 438/387; 257/E21.008; 257/E21.011; 257/E21.017

(58) Field of Classification Search .................. 438/381, 438/386, 387; 257/E21.008, E21.011, E21.017
See application file for complete search history.

(56) References Cited

U.S. PATENT DOCUMENTS
6,002,149 A * 12/1999 Dennison et al. ............. 257/309
* cited by examiner

*Primary Examiner* — Alexander G Ghyka
*Assistant Examiner* — Seahvosh J Nikmanesh
(74) *Attorney, Agent, or Firm* — John N. Greaves

(57) ABSTRACT

A process of forming a semiconductive capacitor device for a memory circuit includes forming a first capacitor cell recess and a second capacitor cell recess that are spaced apart by a capacitor cell boundary of a first height. The process includes lowering the first height of the capacitor cell boundary to a second height. A common plate capacitor bridges between the first recess and the second recess over the boundary above the second height and below the first height.

22 Claims, 6 Drawing Sheets

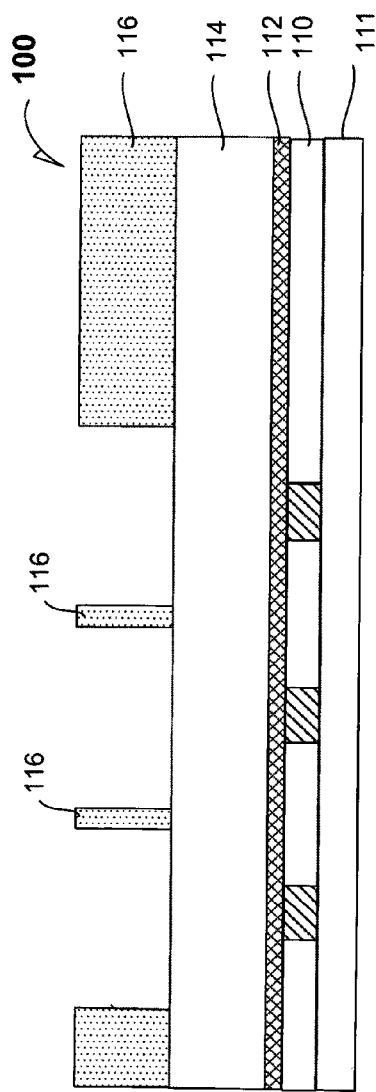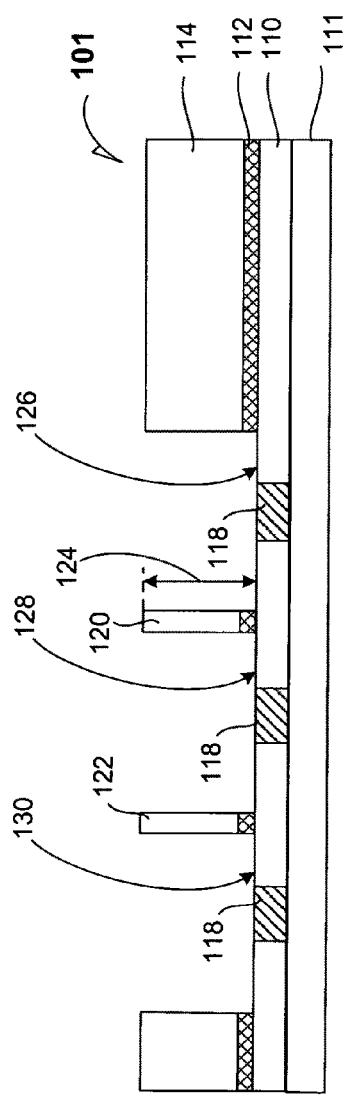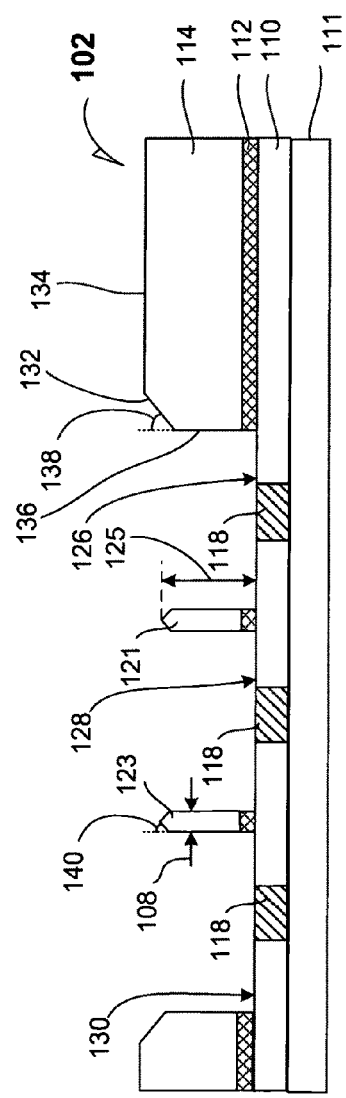

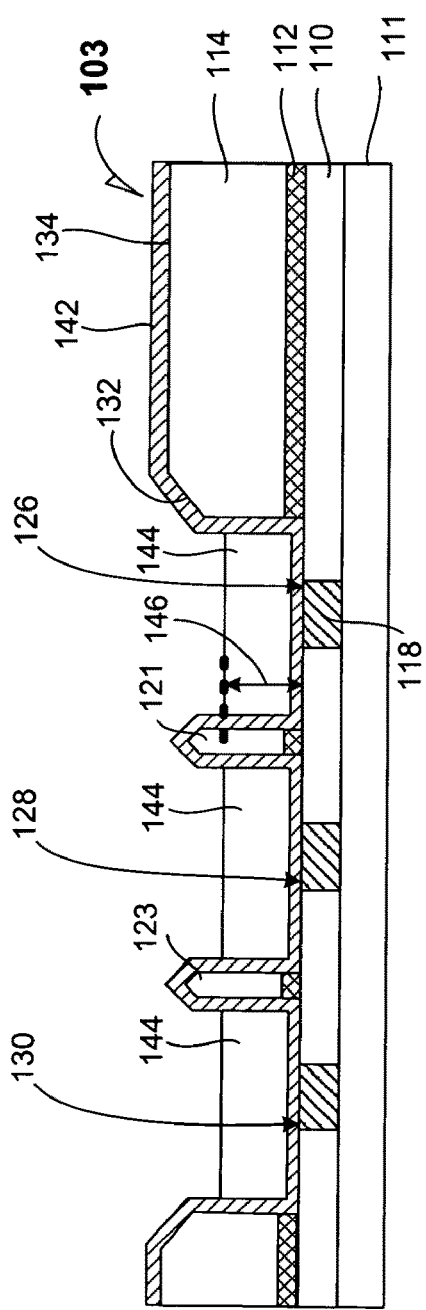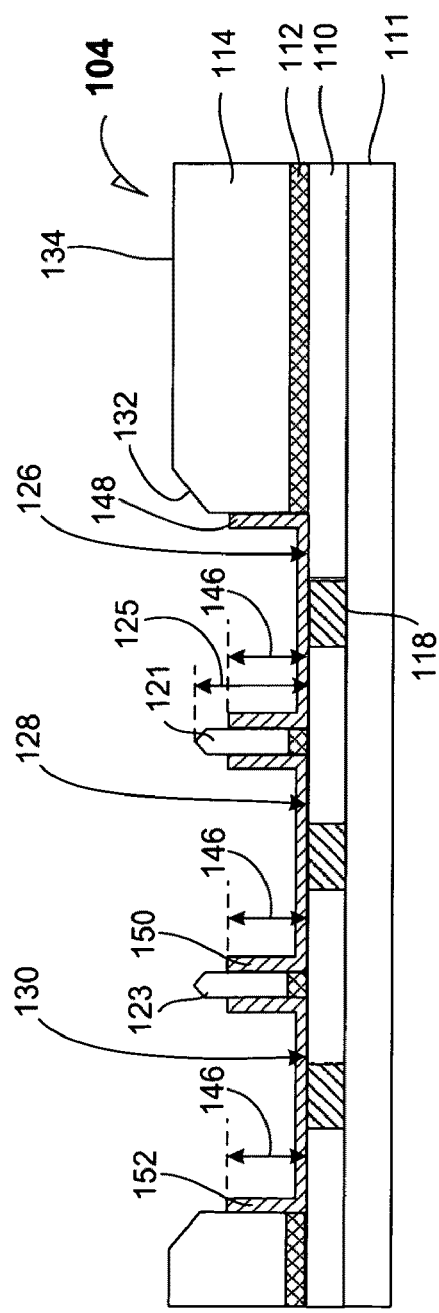

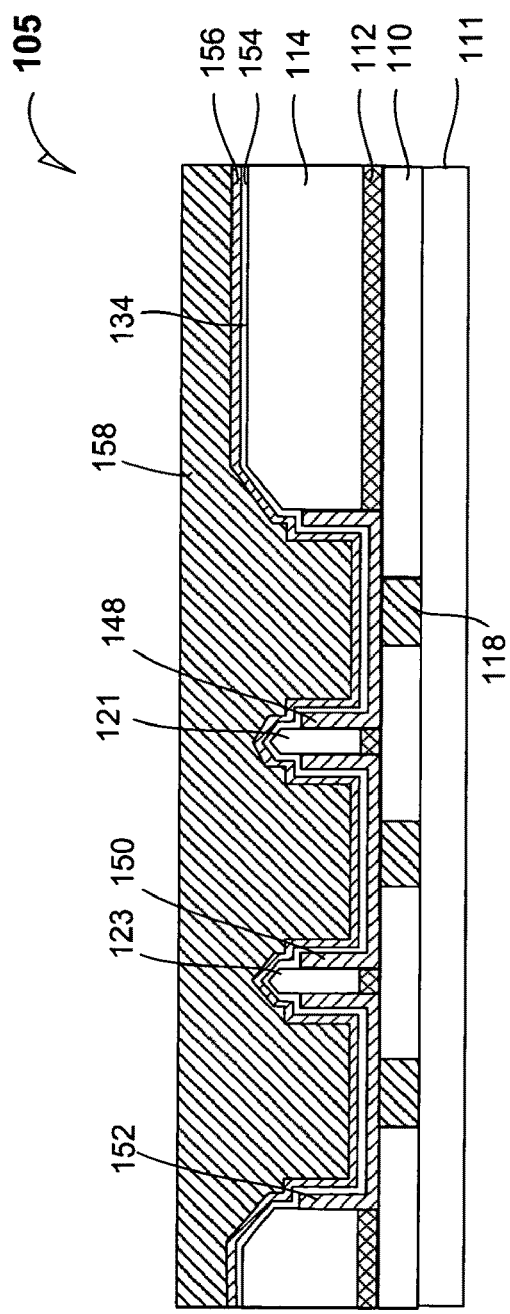
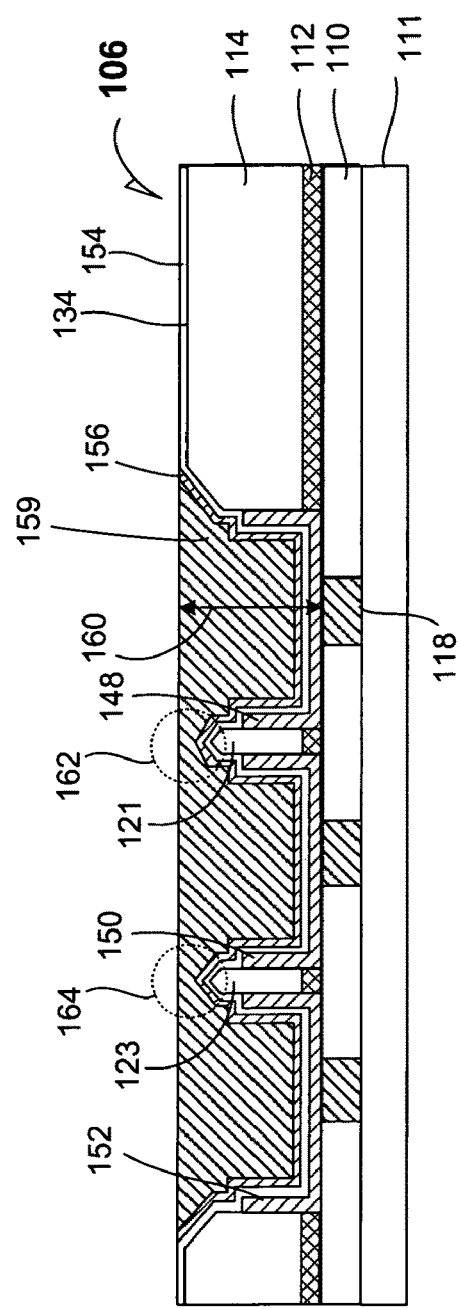

COMMON PLATE CAPACITOR ARRAY CONNECTIONS, AND PROCESSES OF MAKING SAME

TECHNICAL FIELD

Disclosed embodiments relate to semiconductor capacitor devices and processes of making them.

BACKGROUND

Many layers of connectivity are required in typical back-end processing for semiconductor chips such as for cell and plate fabrication of dynamic random-access memory cells. Several techniques have been used including forming a plate metal layer that is used to connect to the tops of individual capacitors. This requires an extra metal layer, complete with the usual lithography requirements, etch requirements, capacitor cell-filling requirements, and polishing associated with dual-damascene processing. Another method is to separately pattern a plate connection directly on top of the capacitor cell, which also requires several processes.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of a capacitor structure during processing according to an example embodiment.

FIG. 1b is a cross-section elevation of a capacitor structure depicted in FIG. 1a after further during processing according to an embodiment;

FIG. 1c is a cross-section elevation of a capacitor structure depicted in FIG. 1b after further during processing according to an embodiment;

FIG. 1d is a cross-section elevation of a capacitor structure depicted in FIG. 1c after further during processing according to an embodiment;

FIG. 1e is a cross-section elevation of a capacitor structure depicted in FIG. 1d after further during processing according to an embodiment;

FIG. 1f is a cross-section elevation of a capacitor structure depicted in FIG. 1e after further during processing according to an embodiment;

FIG. 1g is a cross-section elevation of a capacitor structure depicted in FIG. 1f after further during processing according to an embodiment;

DETAILED DESCRIPTION

Figure 2:
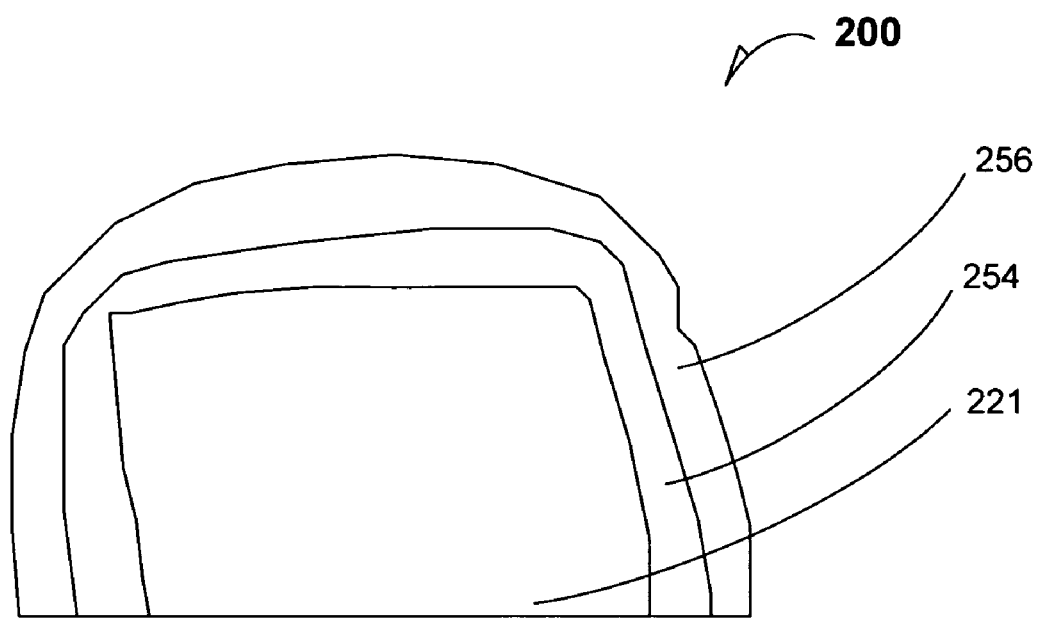
FIG. 2 is a computer-image reproduction of a photomicrograph in cross section elevation of a capacitor cell boundary during processing according to an embodiment.

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

FIG. 1a is a cross-section elevation of a capacitor structure 100 during processing according to an example embodiment. A dielectric layer 110 has been overlaid with a base dielectric layer 112. The base dielectric layer 112 is spaced apart from a semiconductive substrate by the dielectric layer 110. The semiconductive substrate is direct-contact interfaced at the bottom 111 of the dielectric layer 110. The base dielectric layer 112 has been overlaid with a capacitor cell interlayer dielectric layer 114. A mask 116 has been formed and patterned above the interlayer dielectric layer 114 to prepare for a directional etch that will result in capacitor cell recesses.

FIG. 1b is a cross-section elevation of a capacitor structure depicted in FIG. 1a after further during processing according to an embodiment. The capacitor structure 101 has been directionally etched such that the capacitor cell interlayer dielectric layer 114 has been fully penetrated as well as the base dielectric layer 112. Directional etching has stopped on the dielectric layer 110. The directional etching has further exposed capacitor cell bit-line contacts 118 that are in contact with the semiconductive substrate.

The directional etching has also resulted in the capacitor cell interlayer dielectric layer 114 forming a capacitor cell boundary (two occurrences are illustrated in FIG. 1b at 120 and 122) having a first height 124. Ecthing has also resulted in a first capacitor cell recess 126 and an adjacent second capacitor cell recess 128 that is spaced apart in a first direction by the capacitor cell boundary 120. Further as a result of etching, a subsequent capacitor cell recess 130 is adjacent the second capacitor cell recess 128 and is spaced apart by the capacitor cell boundary 122. Unpenetrated portions of the capacitor cell interlayer dielectric layer 114 also exhibit the first height 124. The first capacitor cell recess 126 and an adjacent second capacitor cell recess 128 are spaced apart from the semiconductive substrate in a second direction by the dielectric layer 110.

In an embodiment, the number of capacitor cell recesses is determined by requirements for a memory circuit such as a dynamic random-access memory (DRAM) array number. In an embodiment, the number of capacitor cell recesses is related to an embedded DRAM (eDRAM) array on a processor device. In an embodiment, the number of capacitor cell recesses is related to a dedicated DRAM array on a memory device.

FIG. 1c is a cross-section elevation of a capacitor structure depicted in FIG. 1b after further during processing according to an embodiment. The capacitor structure 102 has been subject to further etching that has resulted in the first height (124, FIG. 1b) of the boundaries 120 and 122 being lowered to a second height 125, and the boundaries 120 and 122 in FIG. 1b are altered and enumerated as the boundaries 121 and 123. A faceting 132 has occurred between a top surface 134 of the capacitor cell interlayer dielectric layer 114 and a wall surface 136 of the first recess 126. The degree of faceting 132 is dependent upon etch conditions such as etch intensity and the degree of directionality of the etch. The degree of faceting 132 is also dependent upon thickness 108 of the boundaries 121 and 123.

In an embodiment, etching is more directional such that clipping of the boundaries 120 and 122 (FIG. 1b) result in the boundaries 121 and 123 at the second height 125 as illustrated in FIG. 1c. In an embodiment, etching is more isotropic such that faceting 132 is more pronounced. Such etching is referred to as flare etching such that the faceting 132 appears as a flaring of the boundaries 121 and 123 to reach the second height 125. The degree of faceting 132, whether by a predominantly clipping effect or a flaring effect, is dependent upon thickness 108 of the boundaries 121 and 123. Faceting of the capacitor cell interlayer dielectric layer 114 may result in a facet angle 138. Further as a result of etching, faceting of the capacitor cell boundary 123 may result in a facet angle 140

FIG. 1d is a cross-section elevation of a capacitor structure depicted in FIG. 1c after further during processing according to an embodiment. The capacitor structure 103 has been processed by conformally depositing a capacitor electrode film 142 into the recesses. In an embodiment, formation of the capacitor electrode film 142 is done simultaneously with clipping of the boundaries 120 and 122 (FIG. 1b) to obtain the boundaries 121 and 122 at the second height 125. Processing may include a plasma physical vapor deposition (PVD, also referred to as sputtering) of the capacitor electrode film 142 under conditions that cause the boundaries 120 and 122 to become the lowered boundaries 121 and 123, respectively. In an embodiment, a plasma sputtering of tantalum is carried out, beginning with the capacitor structure 101 depicted in FIG. 1b, to achieve the capacitor electrode film 142 depicted in FIG. 1d. In an embodiment, tantalum nitride is sputtered to form the capacitor electrode film 142. In an embodiment, titanium is sputtered to form the capacitor electrode film 142. In an embodiment, titanium nitride is sputtered to form the capacitor electrode film 142.

After formation of the capacitor electrode film 142, a sacrificial filler 144 is blanket formed over the capacitor structure 103 and etched back to a third height 146 as depicted. The third height 146 is less than the second height 125 (FIG. 1c). In an embodiment, the sacrificial filler 144 is a dielectric that responds differently to etching processes than the capacitor electrode film 142 such that the capacitor electrode film 142 is virtually unaltered during etchback to form the sacrificial filler 144.

FIG. 1e is a cross-section elevation of a capacitor structure depicted in FIG. 1d after further during processing according to an embodiment. The capacitor structure 104 has been processed by isotropic etching such that the capacitor electrode film 142 has been removed in areas not protected by the sacrificial filler 144. Consequently the capacitor electrode film 142 has been altered in structure to achieve singulated capacitor electrodes. FIG. 1e illustrates singulated capacitor electrodes including a first capacitor electrode 148, a second capacitor electrode 150, and a subsequent capacitor electrode 152.

FIG. 1f is a cross-section elevation of a capacitor structure depicted in FIG. 1e after further during processing according to an embodiment. The capacitor structure 105 has been processed by a conformal deposition of a capacitor cell dielectric film 154 within the respective recesses and upon the top surface 134 of the interlayer dielectric layer 114. In an embodiment, the capacitor cell dielectric film 154 is a high-k material such as. High-k dielectric materials may be materials with a dielectric constant greater than that of silicon dioxide, which is about 4. In an embodiment, the high-k dielectric material is tantalum pentoxide ($Ta_2O_5$). In an embodiment, the high-k dielectric material is hafnium oxide ($HfO_2$). In an embodiment, the high-k dielectric material is zirconium oxide ($ZrO_2$). In an embodiment, the high-k dielectric material is aluminum oxide ($Al_2O_3$). In an embodiment, the high-k dielectric material is barium strontium titanate ($BaSrTiO_3$). In an embodiment, the high-k dielectric material that forms the capacitor cell dielectric film 154 is a composite such as laminates of $ZrO_2/Al_2O_3/ZrO_2$.

In an embodiment, a barrier film 156 is deposited onto the capacitor cell dielectric film 154 to facilitate the formation of a common plate capacitor. In an embodiment, the barrier film 156 is a tantalum (Ta) material. In an embodiment, the barrier film 156 is a tantalum nitride ($Ta_xN_y$) material, where x and y may represent stoichiometric and non-stoichiometric ratios. In an embodiment, the barrier film is a titanium (Ti) material. In an embodiment, the barrier film 156 is a titanium nitride ($Ti_xN_y$) material, where x and y may represent stoichiometric and non-stoichiometric ratios. The barrier film 156 is to make physical contact with a common plate capacitor. After formation of the barrier film 156, if it is present, a blanket deposition of a common plate capacitor precursor 158 is formed over the capacitor cell dielectric film 154.

FIG. 1g is a cross-section elevation of a capacitor structure depicted in FIG. 1f after further during processing according to an embodiment. The capacitor structure 106 has been processed by a height-reduction procedure on the common plate capacitor precursor 158 (FIG. 1f) to achieve a common plate capacitor 159. In an embodiment, processing is done by a chemical-mechanical polishing (CMP) procedure that stops on the capacitor cell dielectric film 154 and/or the capacitor cell interlayer dielectric layer 114. The polishing procedure results in a fourth height 160, measured from the bottom of the recesses, which is greater than the second height 125, which is the height of the boundaries 121 and 123 after clipping or flaring has been accomplished as set forth above.

As a consequence of the polishing procedure, the common plate capacitor 159 forms a capacitance bridge 162 between the first capacitor electrode 148 and the second capacitor electrode 150. Further as a consequence of the polishing procedure, the common plate capacitor 159 also forms a capacitance bridge 164 between the second capacitor electrode 150 and the subsequent capacitor electrode 152. The common plate capacitor 159 has a solid-plug form factor within each recess. Consequently, the common plate capacitor 159 completes each capacitor structure and the array of capacitors is a common plate structure by virtue of the capacitance bridges 162 and 164.

FIG. 2 is a computer-image reproduction of a photomicrograph 200 in cross section elevation of a capacitor cell boundary during processing according to an embodiment. The photomicrograph relates partially to the illustrated capacitance bridge sections 162 and 164 according to various embodiments. As illustrated, the height of a capacitor cell boundary 221 was lowered, but it retained a substantially rectangular form factor.

The capacitor cell boundary 221 is illustrated that includes a capacitor cell dielectric film 254 that was formed. In an embodiment, the capacitor cell boundary 221 is etched by a clipping procedure to achieve a lowered, second height compared to a first height. In an embodiment, the capacitor cell boundary 221 is etched by a flaring procedure to achieve a lowered, second height compared to a first height.

In an embodiment, a barrier film 256 was formed conformally upon the capacitor cell dielectric film 254.

Figure 3:
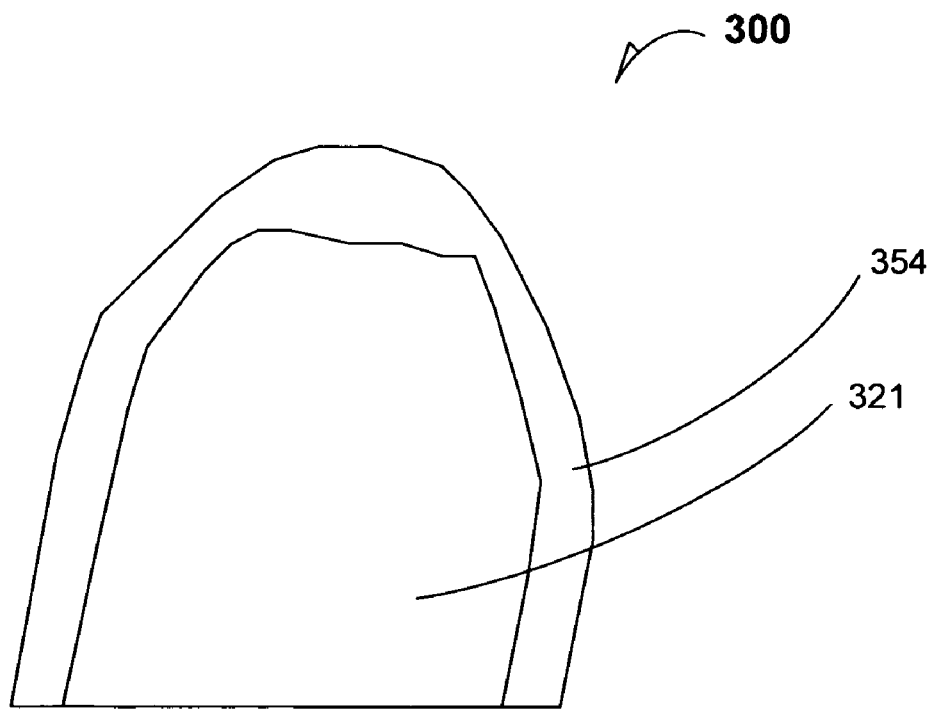
FIG. 3 is a computer-image reproduction of a photomicrograph in cross section elevation of a capacitor cell boundary during processing according to an embodiment.

FIG. 3 is a computer-image reproduction of a photomicrograph 300 in cross section elevation of a capacitor cell boundary during processing according to an embodiment. The photomicrograph also relates partially to the illustrated capacitance bridge sections 162 and 164 according to various embodiments. As illustrated, the height of a capacitor cell boundary 121 was lowered, but it also achieved a substantially truncated cone form factor.

The capacitor cell boundary 321 is illustrated that includes a capacitor cell dielectric film 354 that was formed. In an embodiment, the capacitor cell boundary 321 is etched by a clipping procedure to achieve a lowered, second height compared to a first height. In an embodiment, the capacitor cell boundary 321 is etched by a flaring procedure to achieve a lowered, second height compared to a first height.

Figure 4:
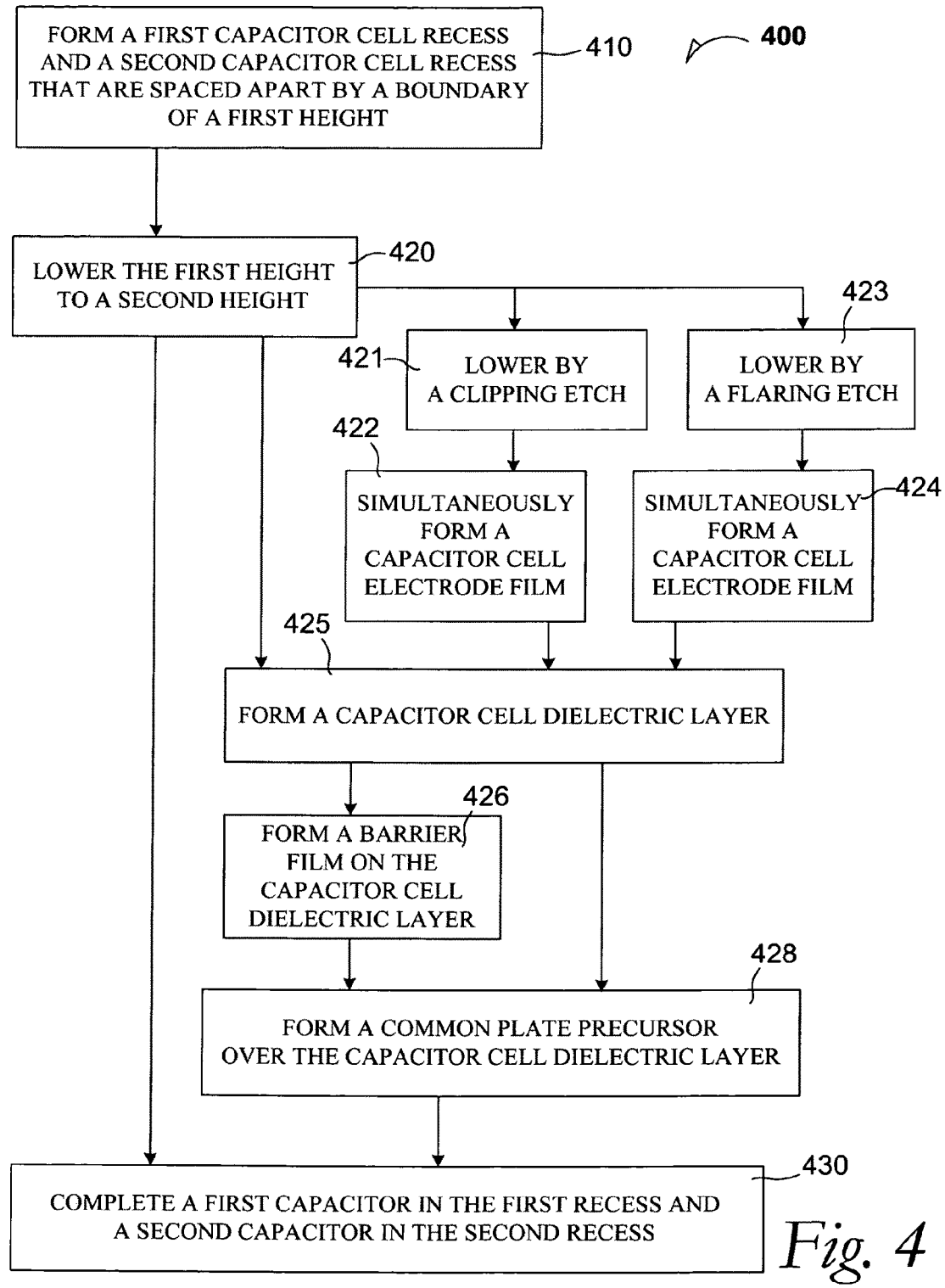
FIG. 4 is a process flow diagram according to an embodiment.

FIG. 4 is a process flow diagram 400 according to an embodiment.

At 410 the process includes forming a first capacitor cell recess and a second capacitor cell recess that are spaced apart by a capacitor cell boundary of a first height.

At 420, the process includes lowering the capacitor cell boundary from the first height to a second height.

At 430, the process includes completing a first capacitor in the first capacitor cell recess and a second capacitor in the second capacitor cell recess.

At 421, the process of lowering of the first height includes a clipping etch. At 422 the clipping etch includes simultaneously forming a capacitor cell electrode film.

At 423, the process of lowering of the first height includes a flaring etch. At 424 the flaring etch includes simultaneously forming a capacitor cell electrode film.

At 425, the process includes forming a capacitor cell dielectric layer.

At 426, the process includes forming a barrier film on the capacitor cell dielectric layer. In a non-limiting example embodiment, a tantalum barrier film is formed. In a non-limiting example embodiment, a tantalum nitride barrier film is formed. In a non-limiting example embodiment, a titanium barrier film is formed. In a non-limiting example embodiment, a titanium nitride barrier film is formed.

At 430, where the process of completing the first capacitor cell and the second capacitor cell are done, the process includes forming a common capacitor cell plate. In a non-limiting example embodiment, forming the common plate capacitor structure includes a blanket deposition of a plate structure such as a copper metal, followed by a CMP procedure that leaves the bridge 162 in the case of the first capacitor electrode 148 and the second capacitor electrode 150.

Figure 5:
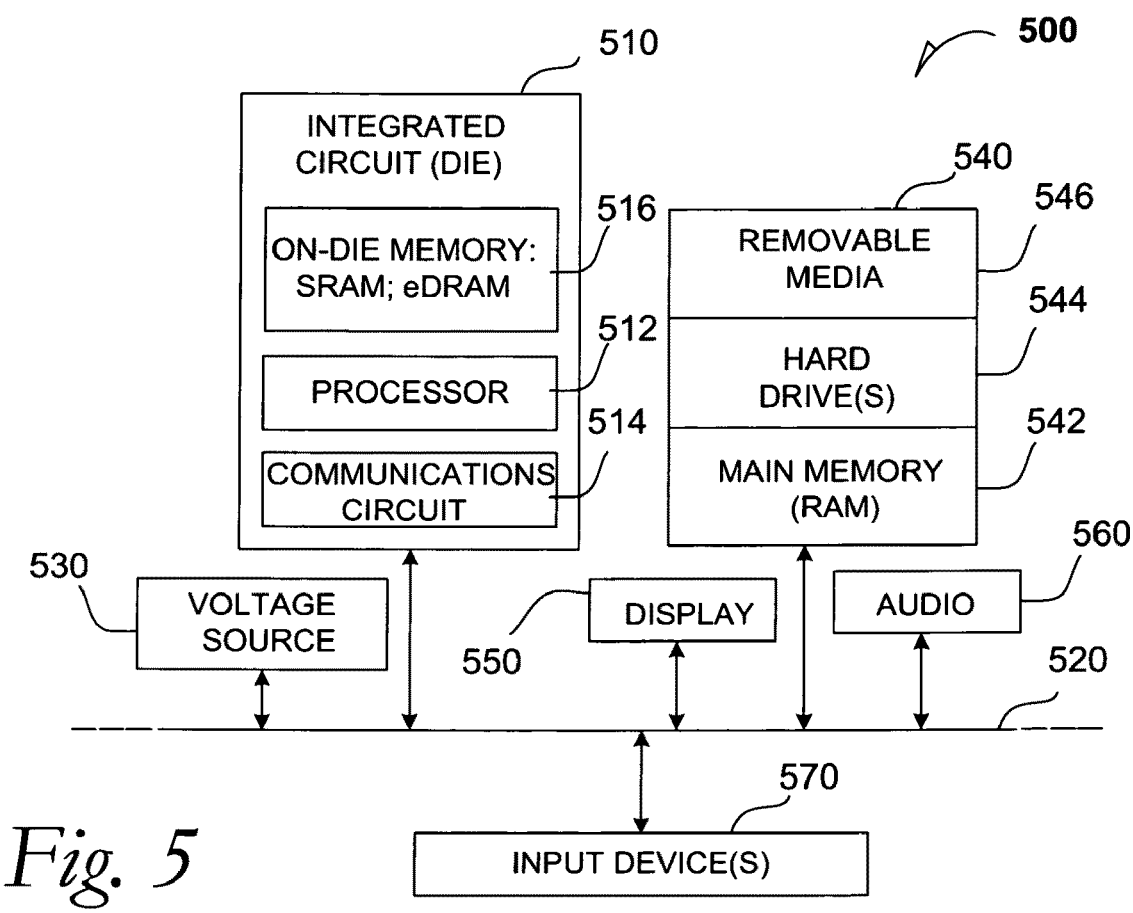
FIG. 5 is a schematic of an electronic system according to an embodiment.

FIG. 5 is a schematic of an electronic system according to an embodiment. The electronic system 500 as depicted can embody a semiconductive capacitor device that includes a common plate capacitor that bridges between a first capacitor cell and a second capacitor cell, over a boundary according to any of the several disclosed embodiments and their equivalents as set forth in this disclosure. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. Other types of circuits that can be included in the integrated circuit 510 are a custom circuit or an application-specific integrated circuit (ASIC), such as a communications circuit 514 for use in wireless devices such as cellular telephones, pagers, portable computers, two-way radios, and similar electronic systems. In an embodiment, the processor 510 includes on-die memory 516 such as static random-access memory (SRAM). In an embodiment, the processor 510 includes embedded on-die memory 516 such as embedded dynamic random-access memory (eDRAM).

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, the integrated circuit 510 can be implemented in a number of different embodiments, including a semiconductive capacitor device that includes a common plate capacitor that bridges between a first capacitor cell and a second capacitor cell, over a boundary according to any of the several disclosed embodiments and their equivalents, an electronic system, a computer system, one or more methods of fabricating an integrated circuit, and one or more methods of fabricating an electronic assembly that includes a semiconductive capacitor device that includes a common plate capacitor that bridges between a first capacitor cell and a second capacitor cell, over a boundary according to any of the several disclosed embodiments as set forth herein in the various embodiments and their art-recognized equivalents. The elements, materials, geometries, dimensions, and sequence of operations can all be varied to suit particular semiconductive capacitor device embodiments that include a common plate capacitor that bridges between a first capacitor cell and a second capacitor cell over a boundary.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
forming a first capacitor cell recess and a second capacitor cell recess spaced apart from a semiconductive substrate by a dielectric layer, wherein the first capacitor cell recess and the second capacitor cell recess are spaced apart by a capacitor cell boundary of a first height;
lowering the first height of the capacitor cell boundary to a second height, wherein lowering the first height to a second height includes forming a flare etching of the capacitor cell boundary; and
completing a first capacitor in the first capacitor cell recess and a second capacitor in the second capacitor cell recess.

2. The process of claim 1, wherein lowering the first height to a second height includes directional etching the capacitor cell boundary to clip the capacitor cell boundary from the first height to the second height.

3. The process of claim 1, wherein lowering the first height to a second height includes directional etching the capacitor cell boundary to clip the capacitor cell boundary from the first height to the second height, and wherein lowering further includes:
simultaneously forming a capacitor cell electrode film on the capacitor cell boundary.

4. The process of claim 1, further including:
forming a first capacitor electrode in the first capacitor cell recess;
forming a second capacitor electrode in the second capacitor cell recess; and
forming a capacitor cell dielectric film over the first capacitor electrode and over the second capacitor electrode.

5. The process of claim 1, further including:
forming a first capacitor electrode in the first capacitor cell recess;
forming a second capacitor electrode in the second capacitor cell recess;
forming a capacitor dielectric film above and on the first capacitor electrode and over the second capacitor electrode; and
forming a top electrode above and on the capacitor dielectric film.

6. The process of claim 1, further including:
forming a subsequent capacitor cell recess adjacent the second capacitor cell recess, wherein the subsequent capacitor cell recess and the second capacitor cell recess are also spaced apart by a capacitor cell boundary of the first height; and
lowering the first height of the boundary between the subsequent capacitor cell recess and the second capacitor cell recess to the second height.

7. A process comprising:
forming a first capacitor cell recess and a second capacitor cell recess spaced apart from a semiconductive substrate by a dielectric layer, wherein the first capacitor cell recess and the second capacitor cell recess are spaced apart by a capacitor cell boundary of a first height;
lowering the first height of the capacitor cell boundary to a second height, wherein lowering the first height to a second height includes forming a flare etching of the capacitor cell boundary, and wherein lowering further includes:
simultaneously forming a capacitor cell electrode film on the capacitor cell boundary.

8. A process comprising:
forming a first capacitor cell recess and second capacitor cell recess adjacent the first capacitor cell recess, wherein the first capacitor cell recess and second capacitor cell recess are spaced apart from a semiconductive substrate by a dielectric layer, wherein the first capacitor cell recess and the second capacitor cell recess are also spaced apart by a capacitor cell boundary of a first height;
lowering the first height of the capacitor cell boundary to a second height;
forming a capacitor cell dielectric layer conformally in the first capacitor cell recess and the second capacitor cell recess and upon the capacitor cell boundary;
forming a common plate capacitor precursor to fill solid form factors into the first capacitor cell recess and the second capacitor cell recess; and
polishing the common plate capacitor precursor to leave a common plate capacitor that bridges between the first capacitor cell recess and the second capacitor cell recess.

9. The process of claim 8, wherein lowering the first height to a second height includes directional etching the capacitor cell boundary to clip the capacitor cell boundary from the first height to the second height.

10. The process of claim 8, wherein lowering the first height to a second height includes directional etching the capacitor cell boundary to clip the capacitor cell boundary from the first height to the second height, and wherein lowering further includes:
simultaneously forming a capacitor cell electrode film on the capacitor cell boundary.

11. The process of claim 8, wherein lowering the first height to a second height includes forming a flare etching of the capacitor cell boundary.

12. The process of claim 8, wherein lowering the first height to a second height includes forming a flare etching of the capacitor cell boundary, and wherein lowering further includes:
simultaneously forming a capacitor cell electrode film on the capacitor cell boundary.

13. A process comprising:
forming mask to define a first capacitor cell recess and a second capacitor cell recess wherein the first capacitor cell recess and a second capacitor cell recess are spaced apart from a semiconductive substrate by a dielectric layer and a base dielectric layer;
directionally etching through the mask to form the first capacitor cell recess and a second capacitor cell recess to fully penetrate the dielectric layer and the base dielectric layer and to expose capacitor cell bit-line contacts in each recess, wherein the first capacitor cell recess and the second capacitor cell recess are spaced apart by a capacitor cell boundary of a first height;
lowering the first height of the capacitor cell boundary to a second height, wherein lowering includes simultaneously forming a capacitor cell electrode film on the capacitor cell boundary and to achieve a capacitor cell boundary second height that is less than the first height;

forming a sacrificial filler in the first- and second cell recesses to a third height that is less than the second height;

isotropically etching the capacitor cell electrode film at the third height;

conformally depositing a capacitor cell dielectric film within the respective recesses;

forming a barrier film onto the capacitor cell dielectric film to facilitate the formation of a common plate capacitor;

blanket depositing a common plate capacitor precursor over the capacitor cell dielectric film; and height-reducing the common plate capacitor precursor to a fourth height that is greater than the second height.

14. The process of claim 13, wherein lowering the first height to a second height includes forming a flare etching of the capacitor cell boundary.

15. The process of claim 13, wherein lowering the first height to a second height includes forming a flare etching of the capacitor cell boundary, and wherein flare etching includes faceting between a top surface of the capacitor cell interlayer dielectric layer and a wall surface of the first recess.

16. The process of claim 13, wherein conformally depositing a capacitor cell dielectric film within the respective recesses includes forming a dielectric film selected from tantalum pentoxide ($Ta_2O_5$), hafnium oxide ($HfO_2$), zirconium oxide ($ZrO_2$), aluminum oxide ($Al_2O_3$), and barium strontium titanate ($BaSrTiO_3$); and wherein forming the barrier film includes forming a barrier film selected from a tantalum (Ta) material, a tantalum nitride ($Ta_xN_y$) material, where x and y represent stoichiometric and non-stoichiometric ratios, titanium (Ti) material, and a titanium nitride ($Ti_xN_y$) material, where x and y represent stoichiometric and non-stoichiometric ratios.

17. The process of claim 13, wherein conformally depositing a capacitor cell dielectric film within the respective recesses includes forming a dielectric laminate film of $ZrO_2/Al_2O_3/ZrO_2$.

18. A process comprising:

forming mask to define a first capacitor cell recess and a second capacitor cell recess wherein the first capacitor cell recess and a second capacitor cell recess are spaced apart from a semiconductive substrate by a dielectric layer and a base dielectric layer;

directionally etching through the mask to form the first capacitor cell recess and a second capacitor cell recess to fully penetrate the dielectric layer and the base dielectric layer and to expose capacitor cell bit-line contacts in each recess, wherein the first capacitor cell recess and the second capacitor cell recess are spaced apart by a capacitor cell boundary of a first height;

lowering the first height of the capacitor cell boundary to a second height; and thereafter forming a capacitor cell electrode film on the capacitor cell boundary and to achieve a capacitor cell boundary second height that is less than the first height;

forming a sacrificial filler in the first- and second cell recesses to a third height that is less than the second height;

isotropically etching the capacitor cell electrode film at the third height;

conformally depositing a capacitor cell dielectric film within the respective recesses;

forming a barrier film onto the capacitor cell dielectric film to facilitate the formation of a common plate capacitor;

blanket depositing a common plate capacitor precursor over the capacitor cell dielectric film; and height-reducing the common plate capacitor precursor to a fourth height that is greater than the second height.

19. The process of claim 18, wherein lowering the first height to a second height includes forming a flare etching of the capacitor cell boundary.

20. The process of claim 18, wherein lowering the first height to a second height includes forming a flare etching of the capacitor cell boundary, and wherein flare etching includes faceting between a top surface of the capacitor cell interlayer dielectric layer and a wall surface of the first recess.

21. The process of claim 18, wherein conformally depositing a capacitor cell dielectric film within the respective recesses includes forming a dielectric film selected from tantalum pentoxide ($Ta_2O_5$), hafnium oxide ($HfO_2$), zirconium oxide ($ZrO_2$), aluminum oxide ($Al_2O_3$), and barium strontium titanate ($BaSrTiO_3$).

22. The process of claim 18, wherein conformally depositing a capacitor cell dielectric film within the respective recesses includes forming a dielectric laminate film of $ZrO_2/Al_2O_3/ZrO_2$.

* * * * *